(12) United States Patent
Taylor, Jr. et al.

(10) Patent No.: US 6,573,160 B2
(45) Date of Patent: *Jun. 3, 2003

(54) METHOD OF RECRYSTALLIZING AN AMORPHOUS REGION OF A SEMICONDUCTOR

(75) Inventors: William J. Taylor, Jr., Round Rock, TX (US); Marius Orlowski, Austin, TX (US); David C. Gilmer, Austin, TX (US); Prasad V. Alluri, Round Rock, TX (US); Christopher C. Hobbs, Austin, TX (US); Michael J. Rendon, Austin, TX (US); Iuval R. Clejan, Austin, TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/578,404

(22) Filed: May 26, 2000

(65) Prior Publication Data

US 2002/0048910 A1 Apr. 25, 2002

(51) Int. Cl.⁷ .................. H01L 21/20; H01L 21/336; H01L 21/26
(52) U.S. Cl. .................. 438/480; 438/198; 438/583
(58) Field of Search .................. 438/142, 149, 438/198, 199, 204, 206, 228, 231, 232, 300, 301, 305, 400, 440, 478, 480, 483, 509, 512, 529, 558, 583, 597, 655

(56) References Cited

U.S. PATENT DOCUMENTS 4,552,595 A  * 11/1985  Hoga .................. 438/440
4,789,644 A  * 12/1988  Meda .................. 438/300

(List continued on next page.)

FOREIGN PATENT DOCUMENTS

| JP | 59190290 A | * 10/1984 | .......... C30B/13/00 |
| JP | 60119733 A | *  6/1985 | .......... H01L/21/322 |
| JP | 60180142 A | *  9/1985 | .......... H01L/21/86 |
| JP | 01270309 A | * 10/1989 | .......... H01L/21/20 |
| JP | 04106915 A | *  4/1992 | .......... H01L/21/20 |
| JP | 06120137 A | *  4/1994 | .......... H01L/21/20 |
| JP | 07321313 A | * 12/1995 | .......... H01L/29/78 |

OTHER PUBLICATIONS

Skorupa et al., Ion–Beam–Induced Epitaxial Crystallisation (IBIEC) of Amorphous Silicon Layers Produced by Chemical Vapor Deposition, IEEE, vol. 24 No. 14, Jul. 1988.*

(List continued on next page.)

*Primary Examiner*—Olik Chaudhuri
*Assistant Examiner*—Brook Kebede
(74) *Attorney, Agent, or Firm*—Robert A. Rodriguez

(57) ABSTRACT

Techniques for forming gate dielectric layers (702) overlying amorphous substrate materials are presented. In addition, techniques for low temperature processing operations that allow for the use of amorphous silicon in doping operations are presented. The amorphous silicon regions (604, 606) are formed prior to formation of structures included in the gate structure (804) of the semiconductor device, where the gate structures (804) are preferably formed using low temperature operations that allow the amorphous silicon regions (604, 606) to remain in an amorphous state. Source/drain regions (1004, 1006) are formed in the amorphous silicon regions (604, 606), and then the substrate is annealed to recrystallize the amorphous regions.

21 Claims, 3 Drawing Sheets

U.S. PATENT DOCUMENTS

| | | | | |
|---|---|---|---|---|
| 5,036,019 | A | * | 7/1991 | Yamane et al. ............. 438/228 |
| 5,374,564 | A | * | 12/1994 | Bruel .................. 148/DIG. 12 |
| 5,429,955 | A | * | 7/1995 | Joyner et al. .......... 204/192.37 |
| 5,508,211 | A | * | 4/1996 | Yee et al. .................... 438/400 |
| 5,763,922 | A | * | 6/1998 | Chau .......................... 257/371 |
| 6,077,752 | A | * | 6/2000 | Norstrom .................... 438/309 |
| 6,150,243 | A | * | 11/2000 | Wieczorek et al. ......... 438/199 |
| 6,156,615 | A | * | 12/2000 | Kepler ........................ 438/305 |
| 6,174,754 | B1 | * | 1/2001 | Lee et al. .................... 438/142 |
| 6,255,195 | B1 | * | 7/2001 | Linn et al. .................. 438/455 |
| 6,407,014 | B1 | * | 6/2002 | Alok .......................... 438/705 |

OTHER PUBLICATIONS

Tsuji et al., "High Performance 50–nm Physical Gate Length pMOSFETs by using Low Temperature Activation by Re–Crystallization Scheme," Silicon Systems Research Labs, 2 pgs. (1999).

Hughes et al., "Effects of Epitaxial Silicon Technology on the Manufacturing Performance of Wafer Fabrication Lines," IEEE, pp. 333–336 (1998).

Tseng et al., "Effects of Isolation Oxides on Undercut Formation and Electrical Characteristics for Silicon Selective Epitaxial Growth," J. Electrochem Soc., vol. 144, pp. 2226–2229 (1997).

Hori et al., "A Novel Isolation Technology Utilizing Si Selective Epitaxial Growth," Scripta Technica, Inc., pp. 40–46 (1997).

Sherman et al., "Elimination of the Sidewall Defects in Selective Epitaxial Growth (SEG) of Silicon for a Dielectric Isolation Technology," IEEE, pp. 267–269 (1996).

* cited by examiner

METHOD OF RECRYSTALLIZING AN AMORPHOUS REGION OF A SEMICONDUCTOR

RELATED APPLICATION

The present invention is related to co-pending U.S. patent application Ser. No. 09/542,706 assigned to the assignee hereof, entitled, "METHOD AND DEVICE UTILIZING INVERSE SLOPE ISOLATION REGIONS IN A SEMICONDUCTOR DEVICE," filed on Apr. 5, 2000, and is hereby incorporated by reference.

1. Field of the Invention

The invention relates generally to semiconductor devices and more particularly to a method and apparatus for forming semiconductor devices utilizing a low temperature process.

2. Background of the Invention

As semiconductor device geometries continue to decrease, conventional silicon oxide gate dielectrics are reaching their limits. Smaller device geometries call for thinner gate dielectric layers in order to preserve the high capacitance that is desired for the gate structure. When silicon oxide is used as the gate dielectric material and very thin gate dielectric layers are desired, problems can arise due to leakage occurring through the very thin silicon oxide gate dielectric layer. As such, higher dielectric constant (higher-K) dielectric materials are being investigated for integration into current processing technology such that high capacitance can be achieved with thicker gate dielectric layers.

A problematic area in the utilization of new high-K dielectric materials arises at the interface between the high-K gate dielectric material and the underlying substrate. Small amounts of silicon oxide may form on the surface of the substrate prior to deposition of the high-K dielectric material. Subsequent annealing steps or other high temperature operations can cause migration of the various materials at this interface, which can lead to undesirable variations in the resulting structure at the interface. Attempts to integrate alternate gate dielectric materials utilize an underlying substrate that is crystalline silicon, and much effort has been expended to understand the additional process steps required to minimize aberrations when these alternate high-K dielectric materials are used in conjunction with underlying crystalline silicon substrates.

Another area of concern as semiconductor device geometries are scaled and developed is ensuring abrupt junctions for the various doped regions within semiconductor device structures. Abrupt junctions are desirable as they improve device-performance by reducing resistance along conductive paths associated with the doped regions.

In order to provide the abrupt junctions desired, specific modifications can be made to the implantation and annealing steps associated with formation of the source and drain regions in the semiconductor device structures. Specifically, variations on the implant operations include: reduction in the energy used, modification of the tilt angle of the implant, and the utilization of amorphous materials as the target for implantation. In terms of modifications to annealing operations, conventional furnace annealing has been replaced with rapid thermal annealing (RTA) operations that utilize much higher temperatures over a shorter time span to achieve the desired annealing operation. More recently these high temperature rapid thermal anneals have been replaced with lower temperature rapid thermal annealing operations such that amorphous substrate regions targeted for implantation can be recrystallized in a manner that minimizes diffusion of the dopants while activating the dopant materials within the crystalline structures that result.

When amorphous substrate materials are used as the targets for implantation steps and subsequently annealed to form the desired semiconductor device regions, end of range defects created at the interface between the amorphous substrate material and the underlying crystalline substrate material can produce undesirable defects in the resulting semiconductor structure. Such undesirable effects can include leakage that degrades device performance. Additional steps such as high temperature annealing can be used to remove or reduce the defects, but such high temperature annealing operations diffuse the dopant materials implanted earlier, thus degrading the abruptness of the junctions. Although low temperature annealing operations allow the abrupt junctions to remain, such low temperature annealing operations also leave the undesired end of range defects in place.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example the dimensions of some of the elements in the figures may be exaggerated relative to other elements to help to improve understanding of embodiments of the present invention.

DETAILED DESCRIPTION OF THE DRAWINGS

Generally, the present invention provides techniques for forming gate dielectric layers overlying amorphous substrate materials such as amorphous silicon. In addition, the present invention provides techniques for low temperature processing operations that allow for the use of amorphous silicon in doping operations such that upon recrystallization of the amorphous silicon, the undesirable effects of defects associated with the interface between the amorphous silicon and the underlying monocrystalline silicon are minimized. The amorphous silicon layer is formed prior to formation of structures included in the gate structure of the semiconductor device, where the gate structures are preferably formed using low temperature operations that allow the amorphous silicon to remain in an amorphous state. By forming the amorphous silicon regions such that the defects produced at the interface between the amorphous silicon and the underlying crystalline silicon are distanced from the active regions of the semiconductor device by a sufficient margin, any undesirable parasitics or leakage that results is minimized.

Figure 1:
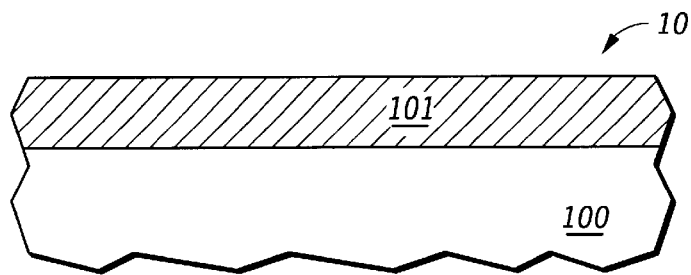
FIG. 1 includes an illustration of a semiconductor substrate over which a region of amorphous material has been formed.

The invention can be better understood with reference to FIGS. 1–11. FIG. 1 illustrates a semiconductor substrate 10 that includes an underlying monocrystalline region 100. In one embodiment, the semiconductor substrate 10 is a silicon substrate where the monocrystalline region 100 is monocrystalline silicon. In other embodiments, substrates such as germanium, gallium arsenide, and other commonly used semiconductor substrate materials may be used.

An amorphous region 101 is formed adjacent to the monocrystalline region 100 of the semiconductor substrate 10. The amorphous region 101 may be formed overlying the monocrystalline region 100. When the underlying monocrystalline material is silicon, the amorphous region 101 includes amorphous silicon. Such amorphous silicon regions may be formed using chemical vapor deposition (CVD) or through ion implantation steps that amorphize the initially crystalline material. For example, a germanium or silicon implantation step could be used to amorphize crystalline silicon to produce amorphous silicon. Amorphization occurs when the implanted species degrades the lattice structure within the formerly crystalline material. Either neutral or non-neutral implantation species can be used to amorphize the substrate material based on the desired doping or lack thereof of the resulting amorphous region 101. If materials other than silicon are included in the underlying monocrystalline substrate portion 100, appropriate amorphized versions of those materials will form the overlying amorphous region 101.

Figure 2:
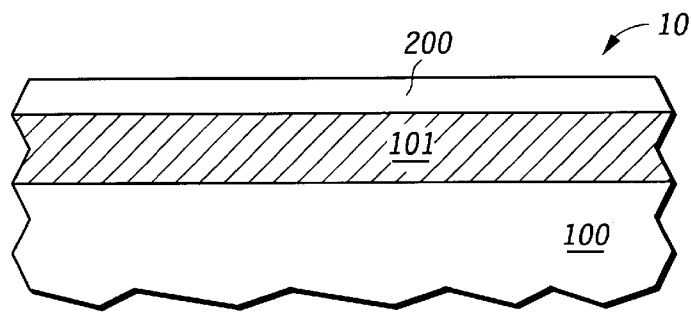
FIG. 2 includes an illustration of the substrate of FIG. 1 following formation of a gate dielectric layer overlying the layer of amorphous material in accordance with a particular embodiment of the present invention.

FIG. 2 illustrates the semiconductor substrate 10 following formation of a gate dielectric layer 200 overlying the amorphous region 101. The gate dielectric layer 200 may be formed using CVD or physical vapor deposition (PVD), where the process temperature and time parameters used do not substantially result in the recrystallization of the amorphous region 101. The gate dielectric layer 200 may be formed of hafnium oxide ($HfO_2$), zirconium oxide ($ZrO_2$), lanthanum oxide (La2O3), aluminum oxide (Al2O3), lanthanum aluminate (LaAlO3), zirconium silicate (Zr-silicate), hafnium silicate (Hf-silicate), other silicates, or other aluminates. In accordance with one embodiment, the gate dielectric layer 200 may be formed of a material having a dielectric constant of at least 5.0. The thickness of the gate dielectric layer 200 is determined based on the dielectric constant of the material selected and the desirable electrical properties for the semiconductor devices being formed. A typical thickness for a gate dielectric layer 200 is on the order of approximately 20–75 angstroms.

Figure 3:
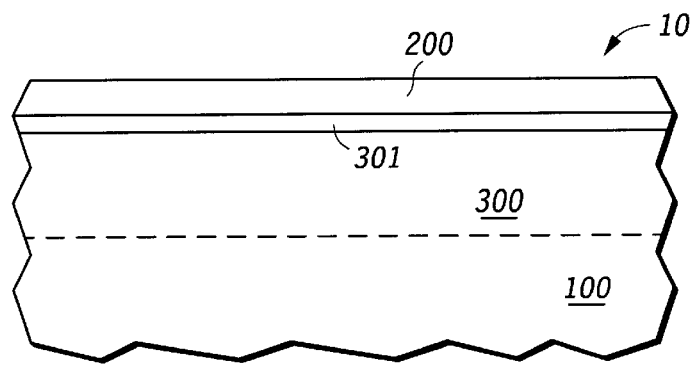
FIG. 3 includes an illustration of the semiconductor substrate of FIG. 2 following the crystallization of the amorphous material layer in accordance with a particular embodiment of the present invention.

FIG. 3 illustrates the semiconductor substrate 10 of FIG. 2 following recrystallization of the amorphous region 101. Recrystallization of the amorphous region 101 results in a recrystallized region 300 as well as an interfacial layer 301 between the gate dielectric layer 200 and the recrystallized region 300. The recrystallized region 300 is preferably merged with the underlying crystalline region 100 such that a uniform monocrystalline region results. Recrystallization of the amorphous region 101 may be accomplished by an annealing step that is preferably performed at low temperatures such that the recrystallization occurs in a controlled and uniform manner. Higher temperature recrystallization may result in undesirable defects within the recrystallized region 300. Typical temperatures desired for recrystallization may be on the order of 500 degrees to 700 degrees C.

Interfacial regions such as the interfacial region 301 are known to result from a limited amount of interaction that occurs at an interface between a dielectric material, such as the gate dielectric layer 200, and a semiconductor material, such as the amorphous region 101. In order to avoid potential undesirable abnormalities within the interfacial layer 301, the amorphous region 101 can be treated using an ultra-pure cleaning step prior to formation of the overlying gate material layer 200. This minimizes the presence of impurities or defects at the interface that may result in undesirable abnormalities within the interfacial layer 301 that could affect performance of devices subsequently formed using the resulting substrate.

The interfacial layer 301 resulting from the recrystallization of the amorphous region 101 following formation of the overlying gate dielectric layer 200 differs, in composition with respect to prior art interfacial layers, such as a silicon oxide interfacial layer produced by depositing a gate dielectric layer overlying silicon already in a monocrystalline state. This difference may be exploited to produce desirable electrical characteristics within semiconductor devices formed that include high-K gate dielectric materials.

The interfacial layer 301 is characterized by at least one electrical property, where the at least one electrical property may include a dielectric constant associated with the interfacial layer 301. The annealing step used to recrystallize the amorphous region 101 may result in an alteration of the electrical property of the interfacial layer. When the electrical property is a dielectric constant, the dielectric constant of the interfacial layer may be advantageously increased by the annealing step.

In some embodiments, at least a portion of the interfacial layer 301 may be formed prior to formation of the gate dielectric layer 200. In one example, following formation of the amorphous region 101, the substrate 10 may be exposed to ambient or oxidizing conditions that result in the growth of silicon oxide on the surface of the amorphous region 101. This silicon oxide may be included in the interfacial layer 301. In addition, other portions of the interfacial layer 301 may be the result of either the formation of the gate dielectric layer 200 or the annealing step used to recrystallize the amorphous region 101 or a combination thereof. Thus, the characteristics and make-up of the interfacial layer 301 may depend on a number of different process parameters.

Figure 4:
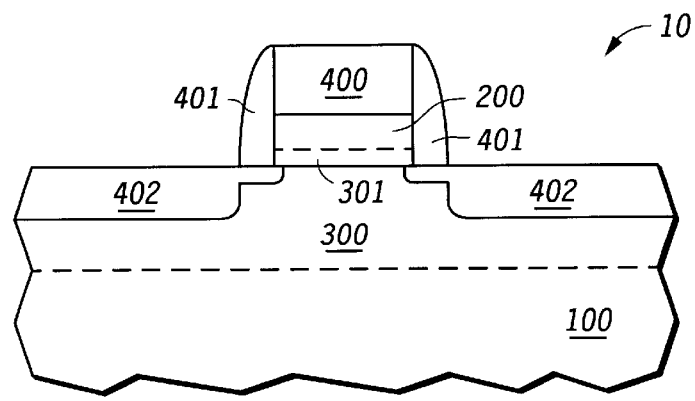
FIG. 4 illustrates the semiconductor substrate of FIG. 3 following additional steps associated with semiconductor device fabrication in accordance with a particular embodiment of the present invention.

FIG. 4 illustrates the semiconductor substrate 10 of FIG. 3 following subsequent processing steps resulting in the formation of a semiconductor device. Such subsequent processing steps include the patterning of a gate structure that includes a gate electrode 400 and remaining portions of the gate dielectric layer 200 and the interfacial layer 301. Additionally, spacers 401 are formed, and implantation steps are used to form the source and drain regions 402. Note that the formation of the source and drain regions 402 may include multiple implantation steps such that extension regions are included in the source and drain structures. The semiconductor device structure illustrated in FIG. 4 exhibits electrical characteristics that are at least partially dependent on the total capacitance associated with the remaining portions of the gate dielectric layer 200 and the interfacial layer 301. As such, the resulting device characteristics of the device structure shown in FIG. 4 will also differ from those characteristics of prior art semiconductor devices that did not deposit the gate dielectric layer on amorphous silicon and then perform recrystallization.

Figure 5:
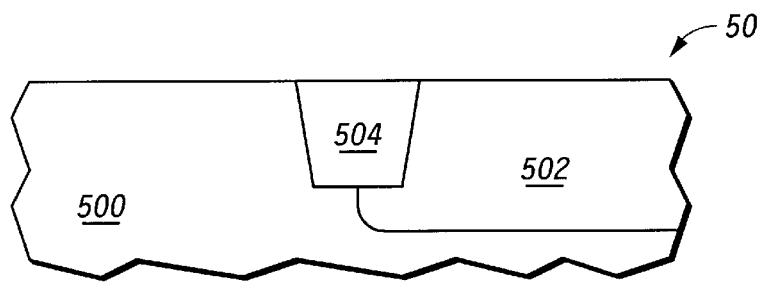
FIG. 5 includes an illustration of a semiconductor substrate that includes N and P wells.

FIGS. 5–11 disclose an alternative embodiment in which an amorphous semiconductor material is re-crystallized after forming doped regions in a semiconductor device substrate. More specifically, FIG. 5 illustrates a semiconductor substrate 50 that includes an isolation region 504, which may be a trench isolation region. In accordance with one embodiment, the isolation region 504 partially separates an N-well region 502 from a P-well region 500. Well structures such as the N and P wells 502 and 500 are well known in the art, and as is apparent to one of ordinary skill in the art, positioning of the N-well and P-well may be interchanged. Such well structures are used to allow complimentary metal oxide semiconductor (CMOS) device formation on the semiconductor substrate 50.

The semiconductor substrate 50 is a monocrystalline substrate material. The semiconductor substrate 50 may be a silicon substrate, such as a monocrystalline silicon wafer commonly used in semiconductor device fabrication. In other embodiments, the semiconductor substrate 50 may include materials such as silicon germanium, gallium arsenide, or other semiconductive materials.

Figure 6:
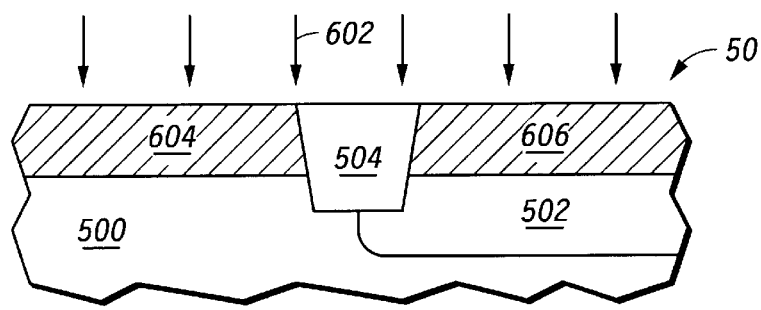
FIG. 6 includes an illustration of the semiconductor substrate of FIG. 5 following steps resulting in formation of an amorphous region in accordance with a particular embodiment of the present invention.

FIG. 6 illustrates the semiconductor substrate 50 following formation of an amorphous region 604. The amorphous region 604 may be formed by deposition (assuming an inverse isolation scheme) or by an implantation step where ions 602 impact the semiconductor substrate 50 and cause the crystal lattice within the monocrystalline substrate material to degrade. Such degradation in the crystal lattice results in the amorphous regions 604 and 606, where the amorphous regions 604 and 606 generally retain the doping characteristics of the N-well and P-well regions 500 and 502.

In accordance with one embodiment, the amorphous regions 604 and 606 are formed to a controlled depth that does not extend below the bottom portion of the isolation region 504. This ensures that any end-of-range defects resulting at the interface between the amorphous regions 604 and 606 and the underlying P-well 500 and N-well 502 do not cause leakage between the well structures.

In one embodiment, the amorphous regions 604 and 606 can also be formed such that the depths of the amorphous regions 604 and 606 extend beyond an expected depletion region associated with source and drain regions formed during subsequent processing steps. Extending the depth beyond the depletion region helps to ensure that the electrical performance of the source and drain regions is not degraded due to the proximity of any electrically active defects created at the interface between the amorphous regions 604 and 606 and the P-well and N-well regions 500 and 502. The relative location of the defects with respect to the source and drain regions is described in additional detail with respect to FIG. 10 below.

The amorphous regions 604 and 606 may be created by performing ion implantation operations utilizing species such as germanium, silicon, or other electrically neutral species. In other embodiments, the implantation species used to form the amorphous regions 604 and 606 may also provide some level of electrical activation through the use of non-neutral species. In one embodiment, the species used is germanium at a dose of $2 \times 10^{15}$ atoms/cm$^2$ and an energy level of 180 KEV. As is apparent to one of ordinary skill in the art, the appropriate concentration and energy with which the implantation step occurs is determined based on the desired depth of the amorphous regions 604 and 606 and the material included in the substrate 50.

The amorphous regions 604 and 606 are typically formed prior to any gate definition steps such that a planar amorphization operation is possible. Blanket amorphization following formation of gate structures is possible, however, it could degrade the composition of these gate structures, thus compromising their performance.

Figure 7:
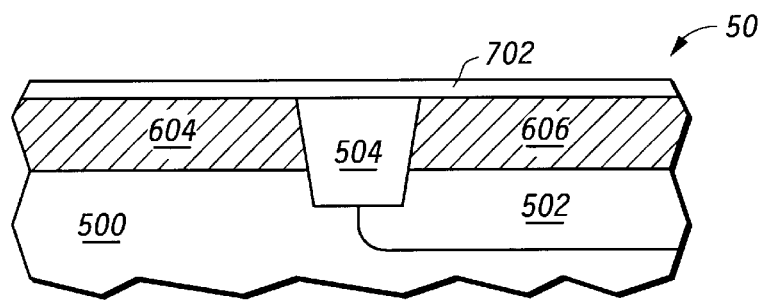
FIG. 7 includes an illustration of the semiconductor substrate of FIG. 6 following formation of a gate dielectric layer in accordance with a particular embodiment of the present invention.

FIG. 7 illustrate's the semiconductor substrate 50 of FIG. 6 following formation of a gate dielectric layer 702 adjacent to the amorphous regions 604 and 606. The gate dielectric layer 702 may be formed of a high-K dielectric material such as zirconium oxide, hafnium oxide or other materials as described previously with respect to FIG. 2. Such formation may be accomplished through CVD or PVD deposition techniques. In one embodiment, the gate dielectric layer 702 is zirconium oxide having a thickness of approximately 40 angstroms. The appropriate thickness of the gate dielectric layer 702 is determined based on the desired electrical characteristics of the device as well as the electrical properties of the gate dielectric material used.

The formation of the gate dielectric material overlying the amorphous regions 604 is preferably accomplished as was described with respect to FIGS. 1–4 above. Formation of the gate dielectric layer 702 is performed using a process temperature and time combination such that do not substantially crystallize the amorphous regions 604 and 606. This differs from the formation of conventional lower-K gate dielectric materials such as silicon oxide, where such formation was commonly performed utilizing higher temperatures that results in recrystallization of amorphous regions. Note that as a result of the formation of the gate dielectric layer 702 overlying the amorphous regions 604 and 606, an interfacial layer is created between the gate dielectric layer 702 and each of the amorphous regions 604 and 606. This interfacial layer is similar to that described with respect to FIGS. 3 and 4 above. The interfacial layer exhibits different electrical properties than an interfacial layer resulting from the formation of a gate dielectric layer directly upon monocrystalline substrate materials such as monocrystalline silicon.

Figure 8:
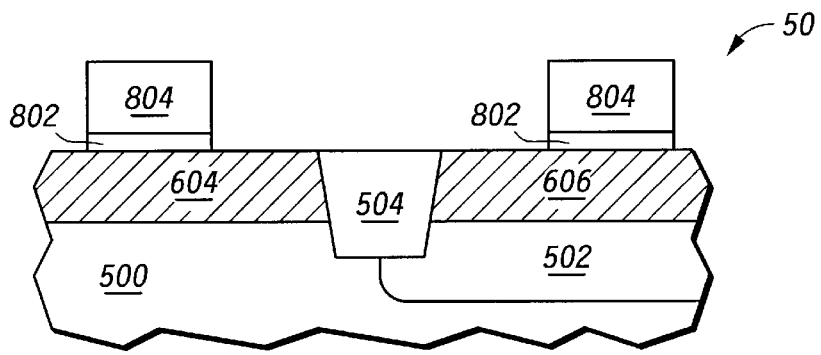
FIG. 8 includes an illustration of the semiconductor substrate of FIG. 7 following formation of a gate electrode and patterning of the underlying gate dielectric layer in accordance with a particular embodiment of the present invention.

FIG. 8 illustrates the semiconductor substrate 50 of FIG. 7 following deposition of a gate electrode material and patterning to form gate electrodes 804 and gate dielectric portions 802. The gate electrodes 804 may be formed by depositing a gate electrode layer that is then patterned to form the gate. The patterning and deposition steps are performed using temperature and time combinations that do not substantially crystallize the amorphous regions 604 and 606. Such patterning and deposition steps required to perform these operations are well known in the art. Note that the composition of the two gate electrodes 804 may differ as each relates to a different type of semiconductor device (one may be P-type, and the other N-type).

Figure 9:
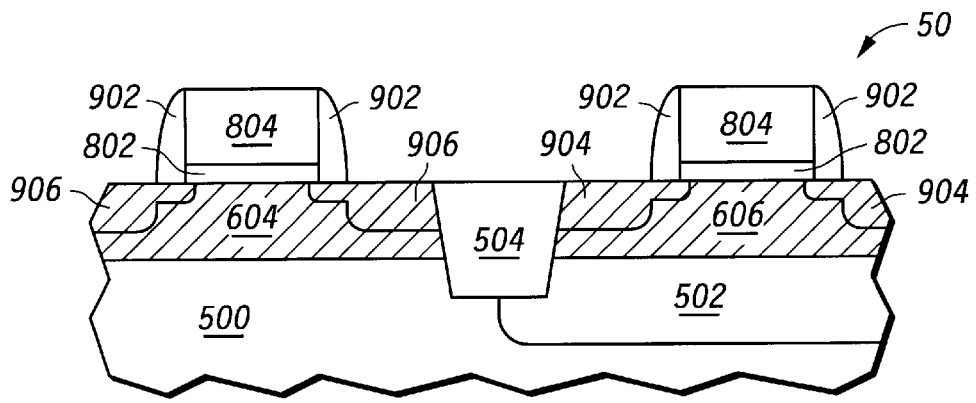
FIG. 9 illustrates the semiconductor substrate portion of FIG. 8 following implantation operations and spacer formation associated with semiconductor device formation in accordance with a particular embodiment of the present invention.

FIG. 9 illustrates the semiconductor substrate 50 of FIG. 8 following subsequent processing steps associated with semiconductor device formation. These subsequent processing steps are performed using temperature and time combinations that do not substantially crystallize the amorphous regions 604 and 606. The gate electrodes 804 may be used to mask a self-aligned implant operation that forms a first portion of the source and drain regions 906 and 904 associated with the different semiconductor devices. Following this self-aligned implant using the gate electrodes 804 as a mask, spacers 902 may be formed to allow for a second self-aligned implant of a more heavily doped portion of the source and drain regions 906 and 904. As such, source and drain regions that include extension regions that are commonly utilized to achieve superior electrical characteristics can be created. The spacers 902 may be formed of silicon nitride in accordance with common spacer formation techniques.

The implant operations associated with formation of the source and drain regions 906 and 904 implant dopant materials into amorphous regions 604 and 606. This may be advantageous over implantation into monocrystalline regions as amorphous structures provide more rapid deceleration of the implantation ions and therefore more abrupt junctions can be achieved. Implantation operations associated with monocrystalline substrates allow deeper penetration of the implantation ions due to their inherent lattice structures.

Figure 10:
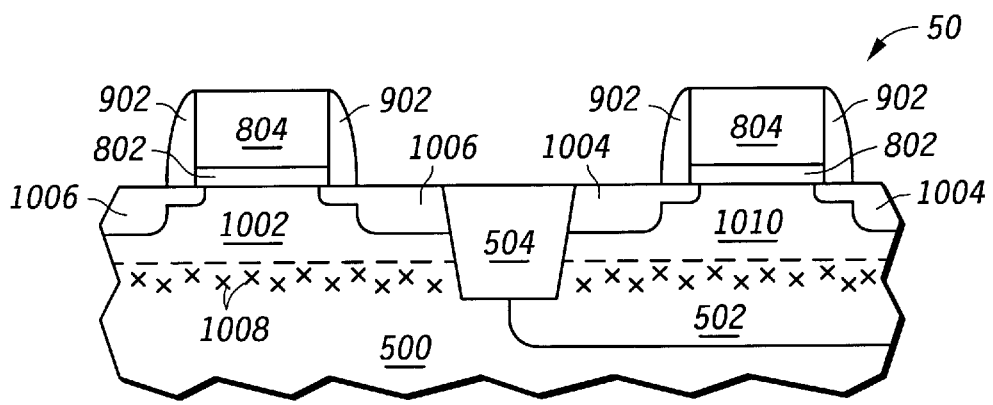
FIG. 10 includes an illustration of the semiconductor substrate of FIG. 9 following recrystallization of the amorphous region in accordance with a particular embodiment of the present invention.

FIG. 10 illustrates the semiconductor substrate 50 of FIG. 9 following an annealing or other high temperature step that allows for recrystallization of the amorphous regions 604 and 606 (including the doped source and drain regions 906 and 904 included in the amorphous regions 604 and 606). As a result, recrystallized regions 1002 and 1010 are formed along with source and drain regions 1006 and 1004 associated with the individual semiconductor devices.

Annealing steps used to recrystallize the amorphous regions 604 and 606 may be performed at a temperature of approximately 500–700 degrees C. such that the recrystallization occurs in a controlled and uniform manner. Such controlled and uniform recrystallization allows the dopant atoms included in the source and drain regions 1006 and 1004 to be activated as they are included in the crystal lattice sites of the crystalline structure formed. As is known, recrystallization of amorphous silicon that includes dopant materials can allow for activation of the dopant materials through their inclusion in the lattice structure of the resulting crystalline silicon with lower temperatures than those required to cause the dopant atoms to be included in the lattice structures if the silicon is already in a crystalline state when doping occurs.

The end of range defects 1008 are shown proximal to the interface of the recrystallized regions 1002 and 1010 and the P- and N-well regions 500 and 502 (i.e. the initial amorphous/crystalline interface). By ensuring that the amorphous regions 604 and 606 are not formed such that they extend beyond the isolation region 504, the position of the defects 1008 can be controlled such that leakage between the P-well 500 and N-well 502 does not occur. As is shown, the defects that remain after annealing are positioned such that they do not intersect with the n-well/p-well junction.

Furthermore, by ensuring that the amorphous regions 604 and 606 are formed such that they extend beyond the depletion regions associated with the source and drain structures 1006 and 1004 of the transistors formed, leakage from the source and drain regions 1006 of the NMOS transistor to the P-well 500 (which now includes the recrystallized region 1002) is avoided. Similarly, leakage from the source and drain regions 1004 of the PMOS device to the N-well 504 (which now includes the recrystallized region 1010) is also avoided. Thus, although the defects 1008 are not eliminated through the use of a high temperature annealing operation, their impact on the electrical characteristics of the semiconductor devices formed is minimized.

By performing the recrystallization of the amorphous regions 604 and 606 using a reasonably low temperatures, migration of dopant atoms associated with the source and drain regions 1006 and 1004 is minimized. As such, abrupt junctions associated with these regions are preserved, thus enhancing device performance.

Figure 11:
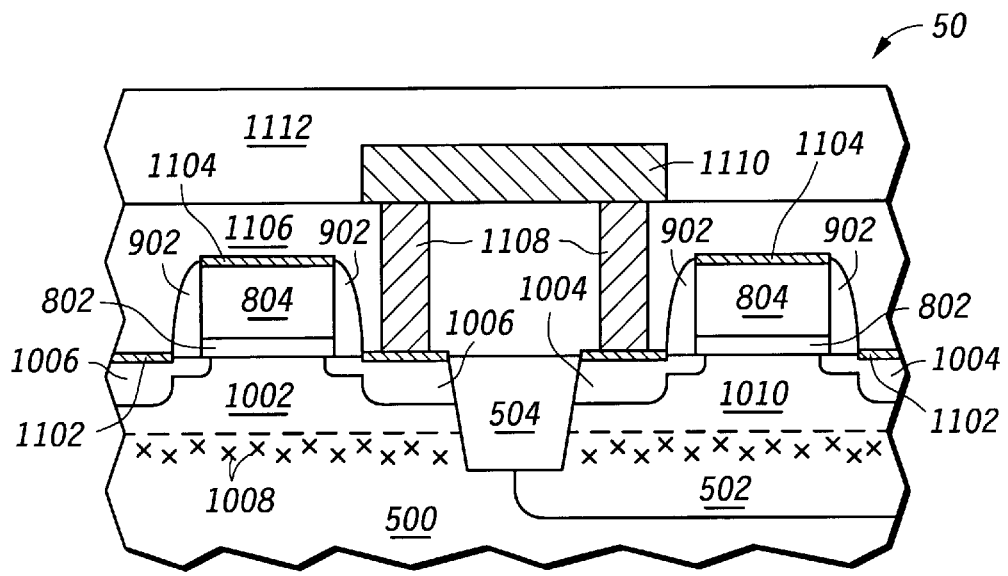
FIG. 11 includes an illustration of the semiconductor substrate of FIG. 10 following additional processing steps associated with semiconductor processing operations.

FIG. 11 illustrates the semiconductor substrate 50 of FIG. 10 following subsequent processing steps associated with semiconductor manufacturing operations. In accordance with one embodiment, silicided regions 1102 and 1104 are formed on the gate electrode and source and drain regions of the substrate to allow for improved electrical connections. The silicided regions formed include source/drain silicided regions 1102 and gate silicided regions 1104. The silicided regions 1102 and 1104 may be formed of cobalt silicide, nickel silicide, or titanium silicide. Such silicided region formation can occur at temperatures between 400 and 800 degrees C. As such, the annealing operations associated with silicided region formation may be used as the annealing operation used to recrystallize the amorphous regions 604 and 606. Improved device performance may be achieved in such a manner as when the silicided region formation coincides with the recrystallization of the source and drain regions, an improved interface between these regions may result.

Additional structures illustrated in FIG. 11 include inter-level dielectric layers (ILDs) 1106 and 1112. Within the ILD 1106, conductive plugs, or contacts 1108 are used to provide electrical coupling to the various regions of the semiconductor devices formed. Although only a portion of the electrically conductive paths associated with the structures formed may be illustrated in FIG. 11, it is apparent to one of ordinary skill in the art that additional connections may be made to the gate electrodes 804 and the remaining source and drain regions 1004 and 1006. The presence of the silicided regions 1102 and 1104 enhances such connectivity. The ILD layer 1112 is shown to include interconnect 1110 that allows for electrical conductivity between different devices that may be included on an integrated circuit.

By forming gate dielectric layers and other semiconductor device components overlying amorphous substrate materials such as amorphous silicon at low temperatures such that recrystallization of the amorphous silicon does not occur, source and drain regions having abrupt, well-activated doping profiles can advantageously be achieved. By controlling the depth of the amorphous regions associated with such processing steps, defects present at the interface between the amorphous regions and underlying crystalline regions can be positioned in a manner that minimizes their impact on the resulting device characteristics and performance. All of the processing steps required to form devices in accordance with the teachings herein can be achieved without the use of exotic processing steps that differ significantly from conventional processing operations currently employed in the art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising the sequential steps of:

forming an amorphous region on a first monocrystalline region of a semiconductor substrate;

forming a gate dielectric layer overlying the amorphous region; and annealing the semiconductor substrate, wherein annealing the semiconductor substrate crystallizes the amorphous region to form a second monocrystalline region having an interfacial layer disposed between the gate dielectric layer and the second monocrystalline region and further wherein the first and second monocrystalline regions form a uniform crystalline region.

2. The method of claim 1 wherein at least a portion of the interfacial layer is formed prior to forming the gate dielectric layer.

3. The method of claim 1, wherein at least a portion of the interfacial layer is formed during forming a gate dielectric layer.

4. The method of claim 1, wherein annealing the semiconductor substrate further comprises increasing a dielectric constant of the interfacial layer.

5. The method of claim 1, wherein forming the gate dielectric layer comprises forming the gate dielectric layer at a formation temperature that is less than a temperature which would crystallize at least a portion of the amorphous region.

6. The method of claim 1, wherein the amorphous region includes amorphous silicon and the first and second monocrystalline regions include monocrystalline silicon.

7. The method of claim 6, wherein forming amorphous silicon includes chemically vapor depositing amorphous silicon on the monocrystalline silicon.

8. The method of claim 6, wherein forming amorphous silicon includes implanting a species into the monocrystalline silicon to degrade a lattice structure of the monocrystalline silicon.

9. The method of claim 1, wherein the gate dielectric layer includes a material having a dielectric constant greater than approximately 5.0.

10. The method of claim 9, wherein the gate dielectric layer includes a material selected from a group consisting of zirconium oxide, hafnium oxide, lanthanum oxide, aluminum oxide, lanthanum aluminate, zirconium silicate, and hafnium 'silicate.

11. The method of claim 1, further comprising:

forming a gate electrode layer over the gate dielectric layer;

pattening the gate electrode layer to form a gate structure; and forming source/drain region adjacent the gate structure.

12. The method of claim 1, wherein annealing the semiconductor substrate comprises annealing at a temperature in the range of approximately 500 to 700° C.

13. A method for forming a semiconductor device comprising the sequential steps of:

forming an amorphous semiconductor region having a first thickness overlying a first monocrystalline semiconductor region of a semiconductor substrate;

forming a gate dielectric layer over the amorphous semiconductor region;

forming a gate electrode layer over the gate dielectric layer;

patterning the gate electrode layer to form a gate: forming source/drain regions in the amorphous semiconductor region; and annealing the semiconductor substrate to form a second monocrystalline semiconductor region from portions of the amorphous semiconductor region that include the source/drain regions, wherein the first and second monocrystalline semiconductor regions comprise a uniform crystalline semiconductor region.

14. The method of claim 13, wherein forming an amorphous semiconductor region includes implanting a species into the semiconductor substrate to degrade a lattice structure of a portion semiconductor substrate.

15. The method of claim 14, further comprising:

forming a trench isolation structure in the semiconductor substrate, wherein the trench isolation structure has a bottom portion that extends into the first monocrystalline semiconductor region, and wherein end-of-range defects produced during implanting are positioned beyond a depletion region of the source/drain regions but not beyond a depth of the bottom portion.

16. The method of claim 14, wherein defects from an initial amorphous/crystalline interface that remain after annealing are positioned beyond depletion regions of the source/drain regions.

17. The method of claim 14, wherein defects from an initial amorphous/crystalline interface that remain after annealing are positioned such that they do not intersect with the n-well/p-well junction.

18. The method of claim 14, wherein the amorphous semiconductor region includes amorphous silicon and the first and second monocrystalline semiconductor regions include monocrystalline silicon.

19. The method of claim 13, wherein the gate dielectric layer, the gate electrode layer, and the source/drain regions are all formed using process temperature and time combinations that do not substantially crystallize the amorphous region.

20. The method of claim 13, further comprising forming silicided source/drain regions of the semiconductor device.

21. The method of claim 20 wherein forming silicided source/drain regions and annealing the semiconductor substrate to form a second monocrystalline semiconductor region are performed during a same processing step.

* * * * *

UNITED STATES PATENT AND TRADEMARK OFFICE
CERTIFICATE OF CORRECTION

PATENT NO. : 6,573,160 B2
DATED : June 3, 2003
INVENTOR(S) : William J. Taylor, Jr. et al.

It is certified that error appears in the above-identified patent and that said Letters Patent is hereby corrected as shown below:

<u>Column 9,</u>
Lines 36-38, please replace with:
-- 2. The method of claim 1 wherein at least a portion of the interfacial layer is formed during forming a gate dielectric layer. --

Signed and Sealed this

Twenty-fifth Day of November, 2003

JAMES E. ROGAN
*Director of the United States Patent and Trademark Office*